United States Patent [19]

Valero

[11] Patent Number: 5,041,396
[45] Date of Patent: Aug. 20, 1991

[54] REUSABLE PACKAGE FOR HOLDING A SEMICONDUCTOR CHIP AND METHOD FOR REUSING THE PACKAGE

[75] Inventor: Leopoldo Valero, El Toro, Calif.

[73] Assignee: VLSI Technology, Inc., San Jose, Calif.

[21] Appl. No.: 585,023

[22] Filed: Sep. 17, 1990

Related U.S. Application Data

[63] Continuation of Ser. No. 381,445, Jul. 18, 1989, abandoned.

[51] Int. Cl.⁵ ............................................. H01L 23/36
[52] U.S. Cl. ................................... 437/209; 206/328; 174/52.4; 437/923
[58] Field of Search ................. 437/209, 923; 206/328; 174/52.4

[56] References Cited

U.S. PATENT DOCUMENTS

| | | | |
|---|---|---|---|
| 3,695,281 | 2/1972 | Serdler | 206/328 X |
| 4,099,200 | 7/1978 | Koutalides | 357/74 X |
| 4,157,611 | 6/1979 | Ohwaki et al. | 357/73 X |
| 4,159,221 | 6/1979 | Schuessler | 357/79 X |
| 4,437,228 | 3/1984 | Yamamoto et al. | 174/52.4 X |
| 4,458,291 | 7/1984 | Yanagisawa et al. | 361/212 |
| 4,483,067 | 11/1984 | Parmentier | 29/840 |
| 4,541,003 | 9/1985 | Ostuka et al. | 357/74 |
| 4,622,433 | 11/1986 | Frampton | 174/52.4 |
| 4,630,095 | 12/1986 | Ostuka et al. | 357/73 X |
| 4,651,192 | 3/1987 | Matsushita et al. | 357/74 |
| 4,769,345 | 9/1988 | Butt et al. | 357/73 X |
| 4,769,690 | 9/1988 | Suzuki et al. | 174/52.4 X |
| 4,780,572 | 10/1988 | Kondo et al. | 174/524 |
| 4,829,666 | 5/1989 | Haghorn-Tehreni et al. | 74/52.4 X |
| 4,839,716 | 6/1989 | Butt | 357/74 |

FOREIGN PATENT DOCUMENTS 2039145  7/1980  United Kingdom ............... 174/52.4

Primary Examiner—Olin Chaudhuri
Assistant Examiner—Andrew Griffis
Attorney, Agent, or Firm—Majestic, Parsons, Siebert & Hsue

[57] ABSTRACT

A reusable semiconductor package such as a ceramic pin grid array package is described. The package includes a housing having a bottom wall for supporting a semiconductor die. The housing defines therein a cavity which is open at the top and which communicates with the environment through a hole in the bottom wall. A disposable base suitable for supporting a semiconductor chip is adapted to be placed on top of the bottom wall. The base covers the hole entirely when it is used to support the chip. The base is then sealingly attached to the housing in a manner that it can be removed from the housing without any substantial damage to the housing. When the package is to be reused for a different chip, the base can be easily removed by applying a force through the hole through the bottom wall. The original die and base may be simply disposed and a new die on a new base be put in their place.

4 Claims, 2 Drawing Sheets

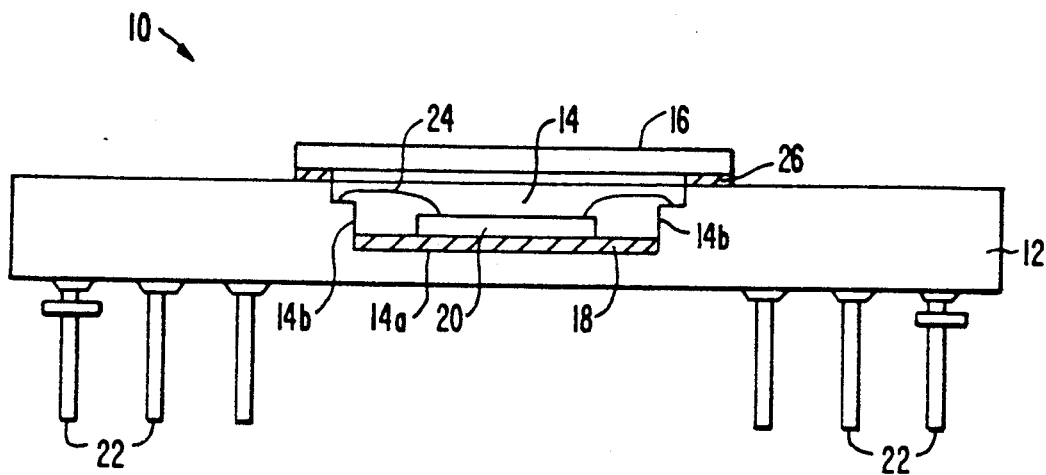
FIG._1.
PRIOR ART
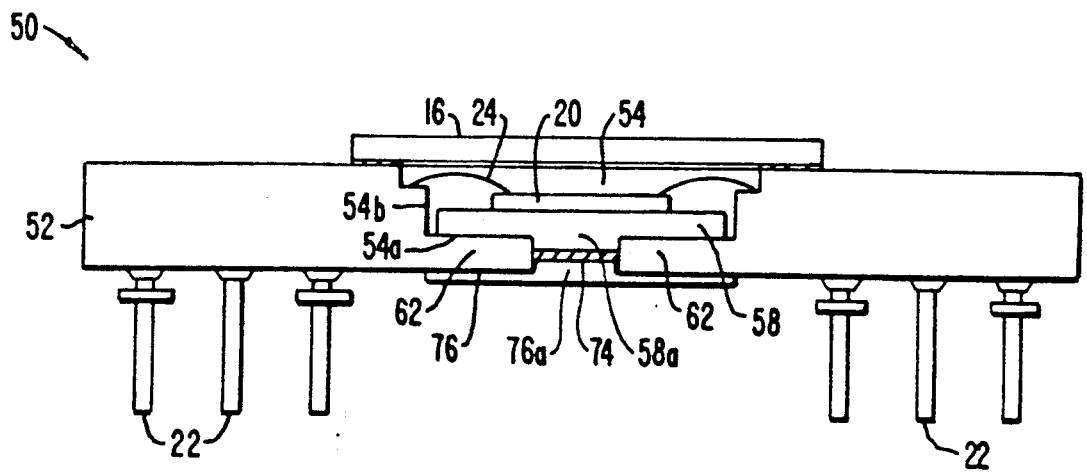
FIG._2.

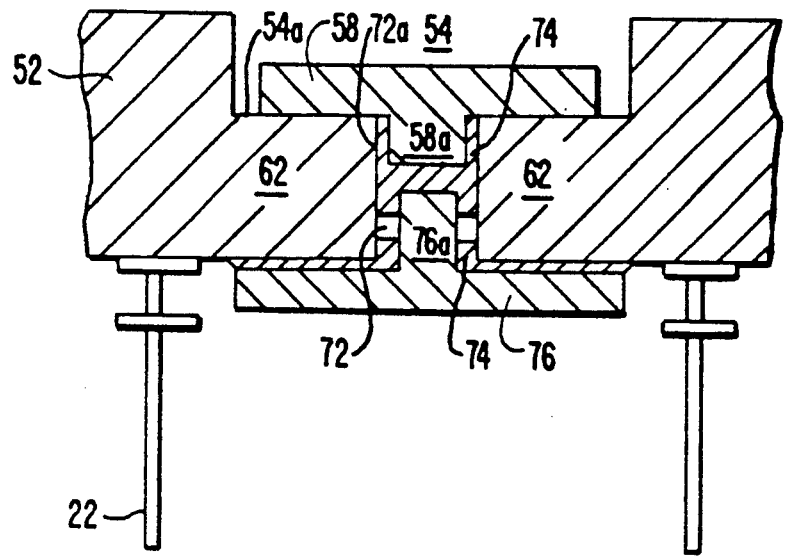
FIG._3.
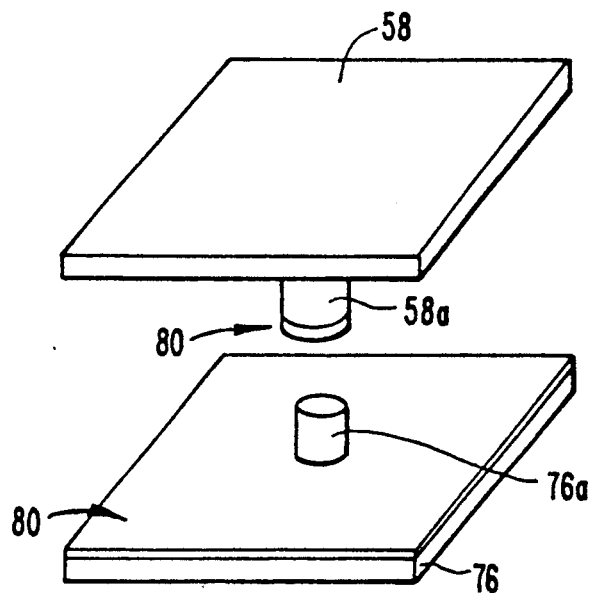
FIG._4.

've patent

REUSABLE PACKAGE FOR HOLDING A SEMICONDUCTOR CHIP AND METHOD FOR REUSING THE PACKAGE

This is a continuation of application Ser. No. 381,445, filed July 18, 1989, now abandoned.

BACKGROUND OF THE INVENTION

This invention relates in general to packages for holding semiconductor chips and in particular to a reusable package for holding a semiconductor chip.

Certain types of packages for holding semiconductor chips are very expensive. Thus a ceramic pin grid array type package may cost $50-$70 per package. When the chip package is no longer usable, the package together with the chip are frequently simply discarded. Disposal of expensive packages in such manner is wasteful of resources. However, conventional packages are not easily reclaimed as explained below.

A conventional ceramic package typically has a cavity for holding the chip. A die attach pad is attached to the bottom surface of the cavity. The die is then attached to the top surface of the die attach pad. Selective points on the die are then connected by bonding wires and bonding fingers to outside pins. The cavity is then sealed by a lid. In order to reclaim the package after it has been used for a chip, the lid is first removed and the original semiconductor die and perhaps also the die attach pad must also be removed before the package can be reused for a different die.

When the original die and the die attach pad are first attached to the bottom surface of the cavity of the package, they are attached securely to assure best performance of the packaged chip during its useful life. For this reason, after the die and the die attach pad are attached to the bottom surface of the cavity, it is difficult to remove the die and the die attach pad from the package. Hence, the cost of reclaiming the package may be comparable to the cost of a new package. This renders reclamation of used expensive packages such as the ceramic pin grid array type packages unattractive.

It is therefore desirable to provide a different type of package which is easier and less expensive to reclaim.

SUMMARY OF THE INVENTION

This invention is based on the observation that the difficulty and cost of reclaiming a conventional ceramic package is caused by its design where the die and the die attach pad are difficult to reach once they have been securely bonded to the bottom surface of the cavity in the package. In addition, in conventional ceramic package design, the bonding material used is such that it is difficult to remove the die and the die attach pad from the package.

This invention is based on the observation that, by providing a hole in the bottom wall of the cavity of the package, the bonding material bonding the die attach pad to the bottom surface of the cavity becomes easily accessible. The hole can be sealed by a material to prevent foreign contaminates in the outside environment from entering the cavity. In the preferred embodiment, the sealing material is one which can be reflowed, and an additional bottom plate is employed with a portion protruding into the hole from the bottom of the package. To reclaim the package after it has been used with a first die, the package is heated to reflow the sealing material so that the die attach pad and the first die can be removed by pushing from the bottom through the hole.

This invention is directed towards a reusable package for holding a semiconductor chip comprising a housing having a bottom wall for supporting a first semiconductor die. The housing defines therein a cavity which is open at the top and which communicates with the environment through a hole in the bottom wall. The package has a lid adapted to be placed on top of the housing to close the cavity from the top. The package also has a disposable base adapted to be placed on top of the bottom wall and to contact and support the first die when it is so placed. The base is of a size and shape that it covers the hole in the bottom wall when it is placed on top of the bottom wall. The package further comprises means for sealingly securing the lid to the top of the housing and for sealingly securing the base to the bottom wall of the housing to seal the cavity and the first die from the environment. The sealing means is such that the lid and the base are removable from the housing without any substantial damage to the housing, so that the package is reusable for a different die.

In order to reuse the package, the lid and the base together with the first die are removed from the housing. The lid, the same or a new base and a second semiconductor die thereon are then secured respectively to the top and bottom wall of the housing, to use the package for the second die.

BRIEF DESCRIPTION OF THE DRAWINGS

FIG. 1 is the cross-sectional view of a conventional ceramic pin grid array package.

FIG. 2 is a cross-sectional view of a reusable ceramic pin grid array type package to illustrate the preferred embodiment of the invention.

FIG. 3 is an enlarged view of certain components of the package of FIG. 2 to illustrate the preferred embodiment of the invention in more detail.

FIG. 4 is a perspective view of the disposable die attach substrate or base, a bottom plate and a reflowable material, all of FIGS. 2 and 3, to illustrate the preferred embodiment of the invention.

DETAILED DESCRIPTION OF THE INVENTION

FIG. 1 is the cross-sectional view of a conventional ceramic pin grid array type package. Conventional package 10 includes a housing 12 which defines therein a cavity 14. Housing 12 surrounds the cavity on all sides except for the top side where cavity 14 is open to the environment. Lid 16 closes the opening from the top to seal cavity 14 off from the environment. Before cavity 14 is sealed from the environment, a die attach pad or substrate 18 is first attached to the bottom surface of cavity 14. A semiconductor chip or die 20 is attached to the top surface of pad 18. Selected points on chip 20 are then connected to pins 22 through bonding fingers and connections (not shown in FIG. 1) by means of bonding wires 24. Then lid 16 closes and seals cavity 14 from the top by means of a bonding material 26 and the package 10 is now ready to be used.

Cavity 14 has bottom surface 14a (top surface of bottom wall 32 of housing 12) and sidewalls 14b. Typically, pad 18 forms a layer on top of surface 14a where the layer abuts sidewalls 14b of the cavity. Chip 20 is firmly attached to pad 18 and pad 18 is usually firmly attached to surface 14a for optimum performance of the packaged chip. Therefore, when it is desirable to remove chip 20 from surface 14a, the removal is a difficult and time consuming task because of the permanence of the adhesion. Since the removal process is tedious, time consuming and costly, conventional packages of the design such as that shown in FIG. 1 is usually not reused when it is desirable to replace chip 20 by a different chip. Instead the package is simply discarded and a new package used. This is wasteful of resources since the package alone may cost between $50–$70.

FIG. 2 is a cross-sectional view of a ceramic pin grid array type package 50 to illustrate the preferred embodiment of the invention. For simplicity, identical parts in FIGS. 1 and 2 are identified by the same numerals. Package 50 includes a housing 52 which defines therein a cavity 54. As noted above, cavity 14 in package 10 of FIG. 1 is open to the environment only through an opening at its top but not at its bottom where the top is closed by a lid 16. Cavity 54, on the other hand, is open both at the top and at the bottom to the environment, where the top opening is again closed by a lid 16 but where the bottom is closed in a manner described below.

Die attach substrate 58 is supported by the bottom surface 54a of the cavity. The die attach pad, base or substrate is used to support a semiconductor chip 20. Selected points on the chip are connected to pins 22 through bonding wires 24 and bonding fingers and connections (not shown in FIG. 2) in housing 52. As shown more clearly in FIG. 3, cavity 54 is also open to the environment through a hole 72 in bottom wall 62, which is filled partly by a protruding portion 58a of base 58, partly by a bonding material 74, and partly by the protruding portion 76a of a bottom plate 76. Hole 72 and the components used for filling the hole are shown in more detail in FIGS. 3 and 4 below.

FIG. 3 is an enlarged view of a portion of FIG. 2 to illustrate the preferred embodiment of the invention. For simplicity, only a portion of housing 52, a portion of cavity 54, base 58, bonding material 74, bottom plate 76 and pins 22 are shown; other components of FIG. 2 have been omitted for simplicity. As shown in FIG. 3, the die attach pad, base or substrate 58 has a portion 58a which protrudes into hole 72. Substrate 58 is attached to surface 72a (which defines hole 72) of housing 12 by bonding material 74 which also seals cavity 54 from the outside environment from the bottom. Bottom plate 76 also has a protruding portion 76a which enters hole 72. Bottom plate 76 is also attached to surface 72a and the bottom surface of housing 52 by bonding material 74.

Bonding material 74 is such that, while it firmly bonds substrate 58 to housing 12 in order to seal cavity 54 from the outside environment, it can be easily removed by a known process. In the preferred embodiment, bonding material 74 is one that can be easily reflowed, such as vitreous glass. Hence, if it is desirable to replace semiconductor chip 20 in a package 50, after lid 16 has been removed, the package is then heated to cause bonding material 74 to reflow. Bottom plate 76 can be then easily removed from housing 52, exposing protruding portion 58a to the outside environment. Hence, an upward force can be easily applied through hole 72 to portion 58a in order to remove pad or base 58 together with chip 20. Base 58 and bottom plate 76 may simply be disposed of and replaced by a new base and bottom plate for a different semiconductor die and package 50 can be reused for packaging such die. Thus, even though the edges of base 58 are also very close to the sidewalls 54b of the cavity in package 50, this presents little difficulty for removing the base in contrast to conventional designs.

As shown in FIG. 2, the bottom wall 62 of housing 52 defines a hole 72 therein. In the preferred embodiment, bottom plate 76 is employed which contacts the bottom surface of wall 62. It will be understood, however, that while the use of bottom plate 76 is preferable it is not essential to the implementation of the invention. Since ultrasonic energy is frequently used for bonding wires to the die after base 58 is in place, a solid base beneath the die is a better medium for transmitting sound waves. The employment of bottom plate 76 improves the transmission of ultrasonic energy for wire bonding. It is also essential for the base 58 on to be lying flat on top of surface 54a. If no bottom plate 76 is employed, it is more difficult to hold base 58 flat when it is bonded to housing 52. Furthermore, to securely seal hole 72, it is preferable to reduce the volume of bonding material necessary to fill hole 72. The protruding portion 76a of the bottom plate reduces the amount of space in hole 72 that must be filled by the bonding material. Besides filling a portion of hole 72 to reduce the amount of space that must be filled, portion 58a of the base has an additional function. It is important to position the base in a predetermined position in the cavity for supporting the die. Portion 58a therefore serves an alignment function. When portion 58a is aligned with hole 72 and inserted into the hole, base 58 is automatically set in the desired predetermined position in the cavity for supporting the die.

The process of bonding base 58 and bottom plate 76 to the bottom wall 62 of housing 52 will now be described in reference to FIG. 4. A bonding material such as vitreous glass may simply form a thin layers of glazed surfaces 80 on the bottom surface of portion 58a and on the top surface of plate 76 as shown in FIG. 4. Base 58 is placed on top of bottom wall 62 until portion 58a is aligned with and falls into hole 72. Bottom plate 76 is also aligned so that portion 76a is aligned with and is inserted into hole 72 until its glazed surface contacts the bottom surface of wall 62. The package is then heated to melt the vitreous glass. The top surface of portion 76a contacts the vitreous glass forming a glazed surface on portion 58a forcing the melted vitreous glass to flow around portions 58a, 76a to form the configuration shown in FIG. 3. The vitreous glass forming the glazed top surface of plate 76 also melts so that a portion of the glass enters hole 72, forming a configuration again as shown in FIG. 3. Base 58 and bottom plate 76 are therefore attached to bottom wall 62 in a manner that seals the bottom part of cavity 54 from the outside environment.

Since vitreous glass is a material which can be easily reflowed, heating the package to an appropriate temperature such as between 400°–480° C. and then removing base 58 and bottom plate 76 will not cause any substantial damage to housing 52. A number of types of vitreous glass may be used for this purpose in a conventional reflow process which is known to those skilled in the art. For simplicity, lid 16 may also be attached to housing 52 by a bonding material 26 which is the same as material 74 and 80, so that in order to reclaim the package, the package may be heated to an appropriate temperature causing materials 26 and 74 to reflow, thereby enabling the lid, base 58 and bottom plate 76 to be removed at about the same time. It will be understood that lid 16, base 58 and bottom plate 76 may be bonded to the housing by different materials as well; all such configurations are within the scope of the invention.

The invention has been described above by reference to the preferred embodiment. It will be understood that various modifications in composition and the detail arrangements may be within the scope of the invention. Thus while the preferred embodiment is described by reference to a ceramic pin grid array type package, the invention may have applications to other types of packages for semiconductor chips as well. The scope of the invention is to be limited only by the appended claims.

I claim:

1. A method for reusing a package for holding a semiconductor chip, said package comprising: (a) a housing having a bottom wall for supporting a first semiconductor die, said housing defining therein a cavity which is open at the top; (b) a lid on top of the housing to close the cavity from the top; (c) a disposable base on top of the bottom wall and contacting and supporting the first die when it is so placed, said base being of a size and shape that it covers the bottom wall; and (d) a material for securing the lid and the base respectively to the top and the bottom wall of the housing to seal the cavity and the first die from the environment, said material being reflowable such that the lid and the base are removable from the housing allowing the housing to be reused, said method comprising the steps of:

heating the package to reflow the material;

removing the lid and base together with the first die from the housing; and securing respectively the lid, and the base with a second semiconductor die thereon to the top and the bottom wall of the housing, to use the package for a second die.

2. The method of claim 1, wherein said material can be reflowed, and wherein said removing and securing steps are performed by reflowing said material.

3. The method of claim 2, wherein said housing has a through hole in the bottom wall, said package further comprising a bottom plate contacting the bottom side of said bottom wall to close the hole from the bottom, said bottom plate being attached to the bottom wall by said material, said removing step further comprising said bottom plate.

4. The method of claim 1, further comprising disposing of the base together with the first die removed from the housing.

* * * * *